United States Patent [19]

McGrail

[11] Patent Number: 4,703,201

[45] Date of Patent: Oct. 27, 1987

[54] CMOS SCHMITT TRIGGER

[75] Inventor: Joseph M. McGrail, Ipswich, England

[73] Assignee: British Telecommunications plc, Great Britain

[21] Appl. No.: 765,491

[22] Filed: Aug. 14, 1985

[30] Foreign Application Priority Data

Aug. 14, 1984 [GB] United Kingdom ............... 8420651

[51] Int. Cl.⁴ .................. H03K 3/29; H03K 3/26; H03K 19/094; H03K 17/687
[52] U.S. Cl. ................................. 307/290; 307/279; 307/451; 307/576; 307/579; 307/585
[58] Field of Search ............... 307/290, 279, 451, 576, 307/579, 585

[56] References Cited

U.S. PATENT DOCUMENTS

| 79,522 | 6/1881 | Seikosha | 307/290 |
|---|---|---|---|
| 3,823,330 | 7/1974 | Rapp . | |
| 4,080,539 | 3/1978 | Stewart . | |
| 4,258,272 | 3/1981 | Huang . | |
| 4,406,957 | 9/1983 | Atherton . | |

FOREIGN PATENT DOCUMENTS 56-72532  6/1981  Japan .

OTHER PUBLICATIONS

*Principles of CMOS VLSI Design*, by Weste & Eshraghian, pp. 37–40.

*Analysis and Design of Digital Integrated Circuits*, by Hodges & Jackson, pp. 39–49.

*Primary Examiner*—John S. Heyman
*Assistant Examiner*—M. R. Wambach
*Attorney, Agent, or Firm*—Nixon & Vanderhye

[57] ABSTRACT

The circuit comprises a first pair of n and p-channel MOSFETS, T1 and T2, whose gates are connected to form the trigger input, whose sources are commoned at node B and whose drains are respectively connected to the positive supply rail (3) and the ground rail (4). Node B is connected to the input to a standard CMOS inverter comprising second p and n-channel MOSFETS T3 and T4. A third p-channel MOSFET T5 has its gate connected to the output of the inverter, its source connected to the positive supply rail and its drain connected to node B. A third n-channel MOSFET T6 also has its gate connected to the output of the inverter, its drain connected to node B, and its source connected to the ground rail.

T5 and T6 act as pull-up and pull-down MOSFETS for the node B to ensure that T4 and T3 are respectively turned hard on when the input at A is high or low.

The threshold for response to a high going signal at input A is determined by the ratio of the sizes of T6 and T1. Similarly, the threshold for response to a low going signal is determined by the ratio of the sizes of T5 and T2.

6 Claims, 2 Drawing Figures

CMOS SCHMITT TRIGGER

FIELD OF THE INVENTION

This invention relates to a Schmitt trigger circuit and in particular to a complementary metal oxide silicon (CMOS) implementation of a Schmitt trigger circuit.

BACKGROUND OF THE PRESENT INVENTION

The Schmitt trigger circuit responds to a slowly changing input waveform to produce fast transitions at the output. The Schmitt trigger is particularly useful in digital circuits, where it may be used to maintain the integrity of the logical one and zero levels. It can also be used with analog systems as a level detector. An important feature of the circuit is that the switching thresholds are different for increasing and decreasing input signals, that is the circuit exhibits hysteresis.

In CMOS, as with other integration technologies, there is a continuing desire to increase the degree of integration to produce more circuits on a wafer of given size. One way in which the number of circuits per unit area may be increased is, of course, to reduce the complexity of circuits.

Known CMOS Schmitt triggers require relatively large numbers (10 or more) of transistors and correspondingly large areas of wafer.

SUMMARY OF THE INVENTION

The present invention provides a Schmitt trigger comprising a first p-channel MOSFET whose drain is connected to a ground rail and a first n-channel MOSFET whose drain is connected to a voltage supply rail positive with respect to said ground rail, whose gates are connected to a common input, and whose sources are connected together; a second p-channel MOSFET whose source is connected to said voltage supply rail, and whose gate is connected to the source of said first p-channel MOSFET, and a second n-channel MOSFET whose source is connected to the ground rail, whose gate is connected to the gate of the second p-channel MOSFET and whose drain is connected to the drain of the second p-channel MOSFET to form a common output; a third p-channel MOSFET whose source is connected to said voltage supply rail, whose drain is connected to the gate of the second p-channel MOSFET and whose gate is connected to the drain of the second p-channel MOSFET; and a third n-channel MOSFET whose source is connected to said ground rail, whose drain is connected to the gate of the second n-channel MOSFET and whose gate is connected to the drain of the second n-channel MOSFET.

Such an arrangement enables a Schmitt trigger to be constructed in CMOS using only six transistors.

A further advantage of this circuit is that its hysteresis is adjustable by varying the size of the pull-up and pull-down MOSFETS so that the desired switching values can be selected.

BRIEF DESCRIPTION OF THE DRAWINGS

An embodiment of the invention will now be described with reference to the accompanying figures in which.

DETAILED DESCRIPTION OF THE DRAWINGS

Figure 1:
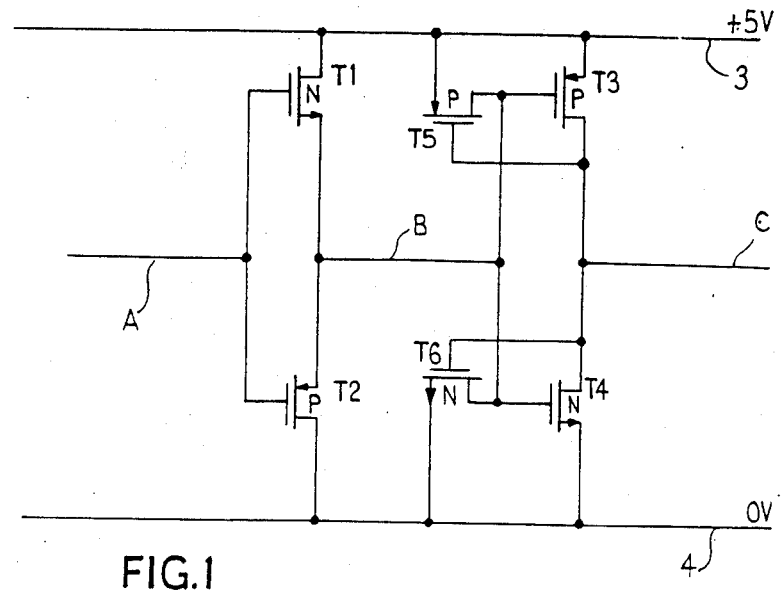
FIG. 1 shows a Schmitt trigger according to the present invention.
Figure 2:
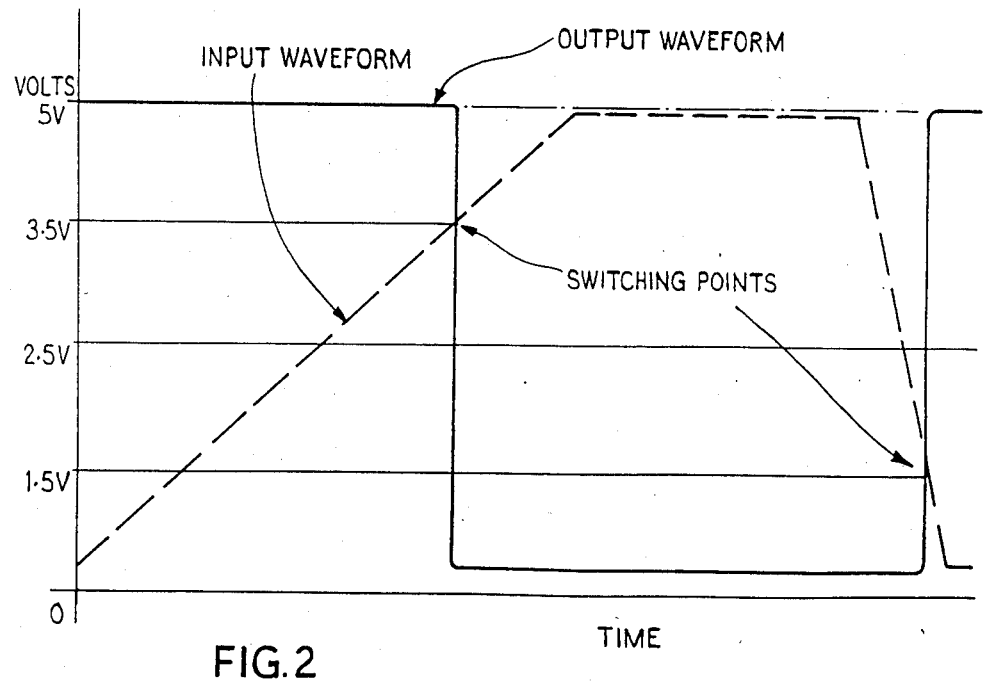
FIG. 2 shows the output waveform of the circuit shown in FIG. 1 for a given input waveform.

In FIG. 1 a Schmitt trigger circuit according to the present invention is shown. The trigger comprises two stages the first (T1,T2) being non-inverting, and the second (T3,T4,T5,T6) being inverting and including a p-channel MOSFET (T3) and an n-channel MOSFET (T4) arranged as a conventional inverter. The first stage, however, has the usual topology of n and p transistors reversed. Thus when switched on the n-channel transistor (T1) is attempting to pull node B up to 5 volts. However, an n-channel transistor cannot pass a voltage greater than a threshold value below the voltage on its gate. Thus for an n-channel transistor with a threshold of 0.7 volts, with its drain at 5 volts and its gate at 5 volts, the voltage on the source could go no higher than 4.3 volts. Similarly with the p transistor (T2) shown in FIG. 1 the node B will always be about 0.7 volts above the gate voltage when the p transistor is on and trying to pull node B down to ground. However, third p and n channel transistors T5 and T6 are provided to ensure that node B is finally pulled to the appropriate supply rail. The gates of T5 and T6 are connected to the commoned drains of inverting pair T3 and T4, their sources are connected to the +5 v supply rail (3) and the ground rail (4) respectively, and their drains connected to the commoned sources of the first transistor pair (T1 and T2).

The Schmitt trigger shown in FIG. 1 operates in the following way. With the input A at a low input voltage level transistor T2 is on and T1 is off. The resulting low at node B ensures that transistor T4 is off and T3 is on. The resulting high at output C caused by the inverting stage between B and C turns transistor T6 on ensuring a true zero at node B and turns transistor T5 off. When the input A changes to a high voltage input level transistor T1 begins to turn on. As explained above though, the voltage level at node B will always be a threshold behind the input so that no charge is passed to B until the input voltage level exceeds 0.7 volts. The rise of voltage level at node B is further delayed though by transistor T6 pulling the node B level to ground. A point is eventually reached where transistor T6 can no longer sink the current being passed by transistor T1 This point is dependent on the ratio in sizes of transistor T6 and T1 and can thus be usefully varied if required. The voltage at node B then rises turning transistor T4 on and T3 off. The voltage at output C falls as a result and this further limits transistor T6's ability to sink the increasing current supplied by transistor T1. The result is a snap action giving a very sharp edge to the change in voltage at node C.

The circuit operates in a similar but opposite fashion when the input voltage level changes from high to low when a falling waveform is applied to the input (the switching points being dependent on the ratio in sizes of transistors T5 and T2).

The circuit has a number of advantages. The circuit only comprises 6 transistors, two of which (T5 and T6) can be very small which means the circuit can save space when incorporated in an integrated circuit. Preferable dimensions for the transistors use would be a uniform length of 2.5 $\mu$m with the following widths: T1, 120 $\mu$m; T2, 175 $\mu$m; T3, 125$\mu$; T4, 80 $\mu$m; T5, 5 $\mu$m; T6, 5 $\mu$m. The design of the circuit uses the intrinsic threshold drops of the transistors to produce a guaranteed hysteresis which together with the switching levels can be varied by appropriate selection of transistor sizes. The circuit is also able to work with many kinds of waveforms such as stepped, ramped or fast waveforms and the switching points are independent on the driving waveform. The circuit can also tolerate large amounts of noise energy.

Transistors T1 and T2 may be provided with a common source electrode.

The circuit may be used as an interface between a TTL circuit and a CMOS circuit.

I claim:

1. A Schmitt trigger comprising:
   a first p-channel MOSFET (T2) whose drain is connected to a ground rail and a first n-channel MOSFET (T1) whose drain is connected to a voltage supply rail positive with respect to said ground rail, whose gates are connected to a common input, and whose sources are connected together, said first p-channel MOSFET and said first n-channel MOSFET forming a non-inverting configuration;
   a second p-channel MOSFET (T3) whose source is connected to said voltage supply rail, and whose gate is connected to the source of said first p-channel MOSFET (T2), and a second n-channel MOSFET (T4) whose source is connected to the ground rail, whose gate is connected to the gate of the second p-channel MOSFET (T3) and whose drain is connected to the drain of the second p-channel MOSFET (T3) to form a common output, said second p-channel MOSFET and said second n-channel MOSFET forming an inverting configuration;
   a third p-channel MOSFET (T5) whose source is connected to said voltage supply rail, whose drain is connected to the gate of the second p-channel MOSFET (T3) and whose gate is connected to the drain of the second p-channel MOSFET (T3); and
   a third n-channel MOSFET (T6) whose source is connected to said ground rail, whose drain is connected to the gate of the second n-channel MOSFET (T4) and whose gate is connected to the drain of the second n-channel MOSFET (T4).

2. A Schmitt trigger circuit as in claim 1 wherein said MOSFETs T1–T6 have channel widths approximately of the following relative values: T1=120, T2=175, T3=125, T4=80, T5=5 and T6=5.

3. A CMOS Schmitt trigger circuit consisting essentially of only six MOS field effect transistor (FETs) interconnected to accept a varying input electrical signal and to produce on a common output line a bi-level output electrical signal,
   which output signal switches from a first to a second level in response to said input signal increasing through a first switching point value, and
   which output signal switches from said second level to said first level in response to said input signal decreasing through a second switching point value,
   a common input for receiving said input signal,
   a first complementary pair of MOSFETs connected in a non-inverting configuration, each having a gate connected to receive said input signal and their respective source-drain paths connected between a pair of voltage supply lines and to an intermediate bus line,
   a second complementary pair of MOSFETs connected in an inverting configuration, each having a gate connected to said intermediate bus line and respective source-drain paths connected between a pair of voltage supply lines and to a common output line, for outputting said bi-level output signal,
   a fifth FET having a gate connected to said common output line and having a source-drain path connected to said intermediate bus line, to the gates of the second pair of FETs and across a first one of said second pair of FETs for maintaining a stable output signals until said first switching point value is reached, after which said fifth FET assists in achieving a rapid change in said output signal; and
   a sixth FET having a gate connected to said common output line and having a source-drain path connected to said intermediate bus line, to the gates of the second pair of FETs and across a second one of said second pair of FETs for maintaining a stable output signal until said second switching point value is reached, after which said sixth FET assists in achieving a rapid change in said output signal
   whereby said first and second switching point values are determined by the relative dimensions of the channels of one of said fifth and sixth MOSFETs and one of said complementary MOSFETs.

4. A Schmitt trigger circuit comprising:
   a first pair of MOSFETs T1 and T2 connected in a non-inverting configuration having gates connected to a common input line A and having their respective source-drain paths connected between a pair of voltage supply lines and to an intermediate bus line B;
   a second pair of MOSFETs T3 and T4 connected in an inverting configuration having gates connected to said intermediate bus line B and having their respective source-drain paths connected between said pair of voltage supply lines and to a common output line C;
   a fifth MOSFET T5 having a gate connected to said common output line C and having a source-drain path connected between a first one of said voltage supply lines and the gate of T3, said source-drain path of said fifth MOSFET being further connected to said intermediate bus line B; and
   a sixth MOSFET T6 having a gate connected to said common output line C and having a source-drain path connected between the other one of said voltage supply lines and the gate of T4, said source-drain path of said sixth MOSFET being further connected to said intermediate bus line B.

5. A Schmitt trigger circuit as in claim 4
   wherein the relative channel dimensions of T6 and T1 determine a first switching point value whereat an increasing input voltage on input line A passing through said first switching point value causes an abrupt change in output voltage on line C from a first output value to a second output value, and
   wherein the relative channel dimensions of T5 and T2 determine a second switching point value whereat a decreasing input voltage on input line A passing through said second switching point value causes an abrupt change in output voltage on line C from said second output value to said first output value.

6. A Schmitt trigger circuit as in claim 5 wherein said MOSFETs T1–T6 have channel width sizes approximately of the following relative values: T1=120, T2=175, T3=125, T4=80, T5=5 and T6=5.

* * * * *